(12) United States Patent
Huang et al.

(10) Patent No.: US 12,363,971 B2
(45) Date of Patent: Jul. 15, 2025

(54) GRADED SUPERLATTICE STRUCTURE FOR GATE ALL AROUND DEVICES

(71) Applicant: Applied Materials, Inc., Santa Clara, CA (US)

(72) Inventors: Yi-Chiau Huang, Fremont, CA (US); Pierre Tomasini, Sunnyvale, CA (US); Abhishek Dube, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 164 days.

(21) Appl. No.: 18/097,722

(22) Filed: Jan. 17, 2023

(65) Prior Publication Data

US 2023/0420521 A1 Dec. 28, 2023

Related U.S. Application Data

(60) Provisional application No. 63/356,283, filed on Jun. 28, 2022.

(51) Int. Cl.
*H10D 62/815* (2025.01)
*H01L 21/02* (2006.01)
*H10D 30/67* (2025.01)

(52) U.S. Cl.
CPC ..... *H10D 62/8164* (2025.01); *H01L 21/0245* (2013.01); *H01L 21/02507* (2013.01); *H01L 21/02532* (2013.01); *H10D 30/6735* (2025.01)

(58) Field of Classification Search
CPC ............ H01L 29/155; H01L 29/42392; H01L 29/1054; H01L 29/66439; H01L 29/66795;

(Continued)

(56) References Cited

U.S. PATENT DOCUMENTS 9,343,303 B2   5/2016  Wang et al.
2006/0009012 A1* 1/2006 Leitz ................. H01L 21/02381
                                                    438/483

(Continued)

FOREIGN PATENT DOCUMENTS

KR         102067424 B1    1/2020

OTHER PUBLICATIONS

Aubertine, D. B., et al., "Influence of Ge concentration and compressive biaxial stress on interdiffusion in Si-rich SiGe alloy heterostructures", Journal of Applied Physics 97, pp. 013531-1-013531-10 (Year: 2005).*

(Continued)

*Primary Examiner* — Peter Bradford
*Assistant Examiner* — Ryan T. Fortin
(74) *Attorney, Agent, or Firm* — Patterson + Sheridan, LLP (57) ABSTRACT

Silicon germanium (SiGe)/silicon containing superlattice structures and methods for forming the same are provided. Various embodiments utilize SiGe layers in a SiGe/Si superlattice structure, which include varying concentrations of germanium throughout the layer. For example, in some embodiments, for each SiGe layer there is a core SiGe film with a low Ge content and two thinner SiGe layers or cladding layers positioned on opposing sides of the core SiGe film with each of the SiGe cladding layers having a higher Ge content then the core SiGe film. Various embodiments provide for SiGe layers having a germanium depth profile enabling strained SiGe superlattice deposition on Si{110} substrates.

20 Claims, 8 Drawing Sheets

(58) Field of Classification Search
CPC . H01L 29/775; H01L 29/785; H01L 21/0245; H01L 21/02507; H01L 21/02532; H01L 21/02381; H01L 21/02433; H01L 21/02661; H01L 21/0262; H10D 30/6735; H10D 62/8164

See application file for complete search history.

(56) References Cited

U.S. PATENT DOCUMENTS

| | | | |
|---|---|---|---|
| 2007/0264801 A1* | 11/2007 | Cody | C30B 29/52 |
| | | | 438/493 |
| 2009/0081853 A1* | 3/2009 | Schumacher | C23C 16/4481 |
| | | | 438/478 |
| 2015/0137198 A1 | 5/2015 | Tsai et al. | |
| 2015/0270120 A1 | 9/2015 | Wang et al. | |
| 2016/0118255 A1 | 4/2016 | Qi et al. | |
| 2020/0105755 A1* | 4/2020 | Cea | H01L 29/78654 |
| 2020/0105872 A1* | 4/2020 | Glass | H01L 21/26513 |
| 2020/0227322 A1 | 7/2020 | Zhou et al. | |
| 2021/0193830 A1 | 6/2021 | More et al. | |
| 2022/0282370 A1* | 9/2022 | Kajbafvala | H01L 21/02532 |

OTHER PUBLICATIONS

Liu, J. P., et al., "A Novel Thin Buffer Concept for Epitaxial Growth of Relaxed SiGe Layers with Low Threading Dislocation Density", Electrochemical and Solid-State Letters 8 (2), pp. G60-G62 (Year: 2005).*

Hartmann, J. M., et al., "Growth kinetics of Si and SiGe on Si(1 0 0), Si(1 1 0) and Si(1 1 1) surfaces", Journal of Crystal Growth 294, pp. 288-295 (Year: 2006).*

Rouchon, D., et al., "Strain In Epitaxial Si/SiGe Graded Buffer Structures Grown On Si(100), Si(110) And Si(111) : A Raman Spectroscopy Study", ECS Transactions 16 (10), pp. 203-214 (Year: 2008).*

International Search Report and Written Opinion Dated May 11, 2023 Re. International Application No. PCT/US2023/010891.

* cited by examiner

GRADED SUPERLATTICE STRUCTURE FOR GATE ALL AROUND DEVICES

CROSS-REFERENCE TO RELATED APPLICATIONS

This application claims the benefit of U.S. Provisional Patent Application Ser. No. 63/356,283, filed Jun. 28, 2022, which is incorporated by reference herein in its entirety.

TECHNICAL FIELD

The present disclosure relates to transistor devices and methods for manufacturing transistor devices. More particularly, the present disclosure relates to superlattice structures that may be used in gate-all around (GAA) transistor devices and methods for manufacturing the same.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thus improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). In a GAA device, all side surfaces of the channel region are surrounded by the gate electrode, which allows for fuller depletion in the channel region and results in less short-channel effects due to a steeper sub-threshold current swing and smaller drain induced barrier lowering (DIBL).

As transistor dimensions are scaled down to smaller technology nodes, there is a need for further improvements in GAA design and manufacturing.

SUMMARY

The present disclosure relates to transistor devices and methods for manufacturing transistor devices. More particularly, the present disclosure relates to superlattice structures that may be used in GAA transistor devices and methods for manufacturing the same.

In one aspect, a device structure is provided. The device structure includes a substrate. The device structure further includes a superlattice structure formed over the substrate. The superlattice structure includes one or more superlattice stacks. The one or more superlattice stacks include a silicon material layer, a first silicon germanium cladding layer having a first germanium concentration and a first thickness, a silicon germanium core layer having a second germanium concentration and a second thickness, and a second silicon germanium cladding layer having a third germanium concentration and a third thickness. The silicon material layer, the first silicon germanium cladding layer, the silicon germanium core layer, and the second silicon germanium cladding layer are disposed in a stacked arrangement. The silicon germanium core layer is positioned between the first silicon germanium cladding layer and the second silicon germanium cladding layer. The first germanium concentration and the third germanium concentration are greater than the second germanium concentration and the first thickness and the third thickness are less than the second thickness.

Implementations may include one or more of the following. A surface of the first silicon germanium cladding layer contacts a surface of the substrate and a surface of the second silicon germanium cladding layer contacts a surface of the silicon material layer. At least one of the first silicon germanium cladding layer, the silicon germanium core layer, and the second silicon germanium cladding layer further includes carbon or boron. The first germanium concentration is in a range from about 10% to about 50%. The first germanium concentration is in a range from about 20% to about 50%. The first germanium concentration is in a range from about 20% to about 40%. The first germanium concentration is in a range from about 30% to about 40%. The first thickness and the third thickness are each independently in a range from about 1 nanometer to about 10 nanometers. The first thickness and the third thickness are each independently greater than 0 and less than or equal to 3 nanometers. The first thickness, the second thickness, and the third thickness have a total thickness in a range from about 5 nanometers to about 20 nanometers. The first thickness, the second thickness, and the third thickness have a total thickness of about 10 nanometers or less. The silicon material has a thickness in a range from about 5 nanometers to about 20 nanometers. The silicon material layer has a thickness of about 10 nanometers or less. The superlattice structure includes between 2 and 5 of the superlattice stacks. The substrate includes silicon {110}.

In another aspect, a method of forming a device structure is provided. The method includes forming a superlattice structure on a substrate. Forming the superlattice structure includes forming a first superlattice stack over the substrate. Forming the first superlattice stack includes forming a first silicon germanium structure using a first deposition process with a first precursor material and a second precursor material. Forming the first silicon germanium structure includes forming a first silicon germanium cladding layer having a first germanium concentration and a first thickness, forming a silicon germanium core layer on the first silicon germanium cladding layer, the silicon germanium core layer having a second germanium concentration and a second thickness, and forming a second silicon germanium cladding layer on the silicon germanium core layer, the second silicon germanium cladding layer having a third germanium concentration and a third thickness. Forming the first superlattice stack further includes forming a first silicon layer using a second deposition process with a third precursor material. The first germanium concentration and the third germanium concentration are greater than the second germanium concentration and the first thickness and the third thickness are less than the second thickness.

Implementations may include one or more of the following. The first deposition process and the second deposition process are epitaxial deposition processes. The first deposition process and the second deposition process are performed in the same processing chamber. The first deposition process is performed at a temperature in a range from about 400 degrees Celsius to about 850 degrees Celsius and at a pressure in a range from about Ultra High Vacuum (e.g., <1

Torr) to about atmospheric pressure. The first deposition process is performed at a temperature in a range from about 600 degrees Celsius to about 680 degrees Celsius and at a pressure in a range from about 1 Torr to about 10 Torr. The first precursor material is dichlorosilane, the second precursor material is germane, and the third precursor material is disilane. The first deposition process is performed with a fourth precursor material, wherein the fourth precursor material is a carbon-containing precursor material. Forming the silicon germanium core layer on the first silicon germanium cladding layer includes decreasing a flow rate of the second precursor material followed by increasing the flow rate of the second precursor material to create a germanium concentration gradient within the silicon germanium core layer. The germanium concentration gradient decreases with an increase in distance from dissimilar materials.

In yet another aspect, a method of forming a device structure is provided. Forming the device structure includes forming a superlattice structure on a substrate. The substrate includes silicon with a <110> crystal orientation. The substrate includes silicon {110}. Forming the superlattice structure includes forming a plurality of superlattice stacks over the substrate. Forming the plurality of superlattice stacks includes forming a first silicon germanium structure using a first deposition process with a first silicon-containing precursor material and a second germanium-containing precursor material. Forming the first silicon germanium structure includes forming a first silicon germanium cladding layer having a first thickness, forming a silicon germanium core layer on the first silicon germanium cladding layer, the silicon germanium core layer having a second thickness, and forming a second silicon germanium cladding layer on the silicon germanium core layer. The second silicon germanium cladding layer has a third thickness. The silicon germanium stack has a germanium concentration gradient that decreases with an increase in distance from dissimilar materials. Forming the plurality of superlattice stacks further includes forming a first silicon layer over the first silicon germanium structure using a second deposition process with a second silicon-containing precursor material. The first thickness and the third thickness are less than the second thickness.

Implementations may include one or more of the following. Forming the device structure further includes forming a gate all-around transistor from the substrate and the superlattice structure.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Interfacial abruptness and uniformity in heterostructures is key to controlling electronic and optical properties. It is also desirable to use materials with increased hole mobility to speed up the devices.

Scaling down of silicon metal oxide semiconductor (MOS) devices has become a major challenge in the semiconductor industry. One problem with the scaling of conventional planar devices are the short channel effects, which start to dominate over device performance. One solution for this problem came with the introduction of multi-gate devices with three-dimensional architecture, such as fin based semiconductor devices or FINFETs and gate-all around (GAA) devices. Due to their three-dimensional architecture with either the gate being wrapped around a thin semiconductor fin for FINFET or the gate electrode surrounding all side surfaces of the channel region for GAA, improved gate control (and thus less short channel effects) over the channel could be achieved by using multiple gates.

However, the introduction of these multi-gate devices has led to additional challenges. For example, one problem being the insufficient mobility of carriers in the device. The development of high mobility semiconductors is desirable to further improve the device performance of electronic devices. Therefore it is desirable to develop multi-gate devices with improved hole mobility to achieve faster electronic devices. Crystalline silicon substrates, for example, Si{110} substrates, are one type of substrate that provides improved hole mobility.

Superlattice structures may be utilized in the fabrication of devices that form integrated circuits. These superlattice structures incorporate films, for example, silicon and silicon germanium films, which possess varying characteristics depending upon the particular application for which the film is being deposited. One characteristic that is key to control for certain applications is film stress. For example, in some applications, it is desirable to form a silicon germanium film having a higher stress (as compared to an underlying silicon substrate) so as to improve electron mobility through the silicon. Such improved electron mobility increases the speed of the device structure.

In other applications, it is desirable to form a silicon germanium film having a lower stress (as compared to an underlying silicon substrate) so as to minimize dislocation of the layer from, for example, the underlying substrate or to minimize the formation of dislocations in the substrate itself. Such dislocations are detrimental to device functionality as they scatter electron/hole motion and/or enhance diffusion where it is undesirable to do so.

Various embodiments provide improved SiGe/Si superlattice structures that can be used with, for example, silicon substrates exhibiting improved hole mobility, for example, Si{110} substrates. The SiGe layers of the SiGe/Si superlattice structure may be formed using a chlorosilane gas source. These chlorosilane gas sources provide for high growth rate with chlorine-surface termination, which leads to excellent interfacial abruptness. This interfacial abruptness provides improved etch selectivity between the SiGe and Si layers in the superlattice structure. Various embodiments also provide improved SiGe/Si superlattice structures which have a lower stress (compared with the underlying silicon substrate) so as to minimize dislocation of the SiGe layer from, for example, the underlying substrate or to minimize the formation of dislocations in the substrate itself. These dislocations can be detrimental to device functionality as they scatter electron/hole motion and/or enhance diffusion where it is undesirable to do so.

Various embodiments utilize SiGe layers in the SiGe/Si superlattice structure, which include varying concentrations of germanium throughout the layer to achieve reduced dislocations or a dislocation-free superlattice. For example, in some embodiments, for each SiGe layer there is a core SiGe film with a low Ge content and two thinner SiGe layers or cladding layers positioned on opposing sides of the core SiGe film with each of the SiGe cladding layers having a higher Ge content than the core SiGe film. Various embodiments provide for SiGe layers having a germanium depth profile enabling strained SiGe superlattice deposition on Si{110} substrates. The SiGe layers may be doped with atoms having a smaller atomic radius. For example, in some embodiments, the SiGe layers may be doped with carbon and/or boron to further reduce strain. As a result, the superlattice structure on crystalline silicon, e.g., Si/SiGe:C/Si{110}, structure is less prone to misfit dislocation relative to previous superlattice designs.

Figure 1:
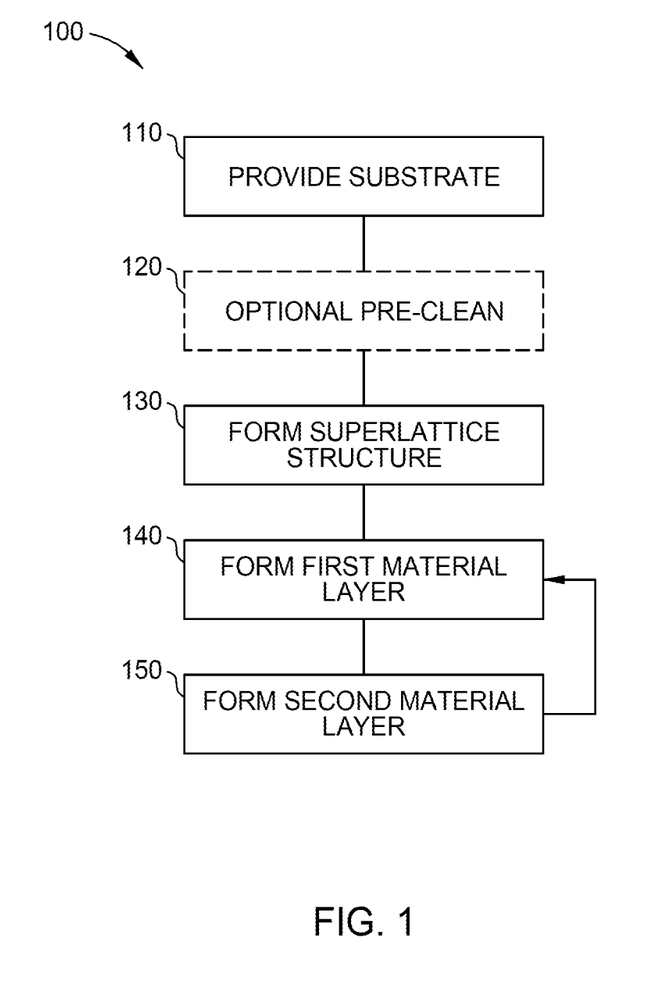
FIG. 1 illustrates a flow chart of a method for manufacturing a superlattice structure in accordance with one or more implementations of the present disclosure.

FIG. 1 illustrates a flow chart of a method 100 for manufacturing a superlattice structure in accordance with one or more implementations of the present disclosure. The method 100 may be part of a multi-operation fabrication process of a semiconductor device, for example, a GAA transistor.

At operation 110, a substrate is provided. In some embodiments, the substrate is a bulk semiconductor substrate. The term bulk semiconductor substrate refers to a substrate in which the entirety of the substrate is comprised of a semiconductor material. The bulk semiconductor substrate includes any suitable semiconducting material and/or combinations of semiconducting materials for forming a semiconductor structure. For example, the semiconducting layer may comprise one or more materials such as crystalline silicon (e.g., Si{100}, Si{110}, or Si{111}), silicon oxide, strained silicon, silicon germanium, doped or undoped polysilicon, doped or undoped silicon substrates, patterned or non-patterned substrates, doped silicon, germanium, gallium arsenide, or other suitable semiconducting materials. In some embodiments, the semiconductor material is silicon. In other embodiments, the semiconductor material is a doped material, such as n-doped silicon (n-Si), or p-doped silicon (p-Si). In particular embodiments, the semiconductor material is Si{110}. Si{110} has improved hole mobility, which may lead to improvement in overall device speed.

At operation 120 of the method 100, in some embodiments, the substrate is exposed to an optional pre-clean or surface treatment process. The substrate undergoes a surface treatment to improve mobility and bias temperature instability (BTI). In some embodiments, the surface treatment includes annealing the substrate in an atmosphere of hydrogen ($H_2$). The anneal process may be any suitable anneal process known to the skilled artisan. In some embodiments, the annealing is a rapid thermal process (RTP) anneal. In some embodiments, the anneal process is conducted at a temperature in a range of from about 500 degrees Celsius to about 900 degrees Celsius, or in a range of from about 600 degrees Celsius to about 900 degrees Celsius, or in a range of from about 600 degrees Celsius to about 800 degrees Celsius. In some embodiments, the anneal process is conducted at a pressure in a range of from about 5 Torr to about 20 Torr.

At operation 130 of the method 100, a superlattice structure is formed on a substrate. The term superlattice, as utilized herein, generally refers to a stack of material layers which are closely lattice matched materials, but are sufficiently different in composition that selective removal processes can be performed on the superlattice structure. More generally, the composition of various material layers in the stack may be unique to one or more of the materials layers in the stack. In one example, the superlattice structure includes one or more layers of a silicon-containing material (e.g., Si) and a silicon germanium containing material (e.g., SiGe). In some embodiments, the superlattice structure includes a first material layer and a second material layer. In some embodiments, the superlattice structure includes a first material layer, a second material layer, a third material layer, and a fourth material layer. In this embodiment, the second material layer, the third material layer, and the fourth material layer are formed from the same compound material, but may have different material properties.

Forming the superlattice structure at operation 130 includes forming a first material layer at operation 140 and forming a second material layer on the first material layer at operation 150. Operation 140 and operation 150 may be repeated until the superlattice structure achieves a desired thickness and/or number of layers. The first material layer and the second material layer may be alternatingly arranged in stacked pairs. The superlattice structure may include a plurality of first material layers and a corresponding plurality of second material layers alternatingly arranged in a plurality of stacked pairs. In one embodiment, the plurality of first layers are formed from a silicon-containing material and the plurality of second layers are formed from at least a silicon-containing material and a germanium-containing material. Accordingly, the first material layer and the second material layer are different materials. In some embodiments, the plurality of first layers and corresponding plurality of second layers are lattice matched materials with a sufficient difference in composition such that selective layer removal can subsequently be performed.

In some embodiments, the plurality of first layers include Group IV materials, such as silicon (e.g., Si). The plurality of second layers include Group IV materials, such as silicon and germanium (e.g., SiGe). In some embodiments, the concentration (atomic percent) of germanium in the silicon germanium layers may be graded. For example, the concentration of germanium may be highest near the interfaces (e.g., top surface and bottom surface of the silicon germanium layer) and decrease from the interfaces toward the center of the silicon germanium layer.

In some embodiments, the silicon germanium layers have a silicon: germanium molar ratio of between about 1:1 and about 5:1. In some embodiments, the silicon germanium layers have a germanium content in a range from about 10% to about 50%, or in a range from about 20% to about 50%, or in a range from about 20% to about 40%, or in a range from about 30% to about 40%. The silicon content may be in a range from about 50% to about 90%, or in a range from about 50% to about 80%, or in a range from about 60% to about 80%, or in a range from about 60% to about 70%. In other embodiments, the silicon germanium layers have a germanium content in a range from about 20% to about 90%, or in a range from about 50% to about 80%. The silicon content may be in a range from about 10% to about 80%, or in a range from about 20% to about 50%.

In some embodiments, the silicon germanium layer includes multiple layers of varying concentration. For example, in some embodiments, the silicon germanium layer includes a first silicon germanium layer or cladding layer having a first germanium concentration, a second silicon germanium layer or core layer having a second germanium concentration, and a third silicon germanium layer of cladding layer having a third germanium concentration. The second silicon germanium layer may be positioned in between or sandwiched in between the first silicon germanium layer and the third silicon germanium layer. The first germanium concentration and the third germanium concentration may be greater than the second germanium concentration. In some embodiments, the first germanium concentration and the third germanium concentration are each independently greater than or equal to 10% of germanium, for example, in a range from about 10% to about 80%, or in a range from about 20% to about 50%, or in a range from about 30% to about 40%, and the second germanium concentration is less than or equal to the first germanium concentration and the third germanium concentration. For example, the second germanium concentration is less than or equal to 20% of germanium, for example, in a range from about 1% to about 20%, or in a range from about 5% to about 15%, or in a range from about 5% to about 10%. In some embodiments, the second germanium concentration is less than or equal to 50%, or less than or equal to 40%, or less than or equal to 30%, or less than or equal to 20%, or less than or equal to 10%, for example, in a range from about 1% to about 50%, or in a range from about 1% to about 40%, or in a range from about 1% to about 30%, or in a range from about 1% to about 20%, or in a range from about 1% to about 10%, or in a range from about 1% to about 5%, or in a range from about 5% to about 10%.

In some embodiments, at least one of the plurality of first material layers and the plurality of second material layers are doped with carbon, for example, Si:C or SiGe:C.

In some embodiments, the first material layer and the second material layer are formed via an epitaxial chemical vapor deposition process. As a result, interfaces between the different atomic species may be controlled, which provides advantageous control of the superlattice structure during subsequent selective etching or modification processes. In some embodiments, the epitaxial deposition process includes loading a substrate into a process chamber and adjusting the conditions within the process chamber to a targeted temperature and pressure. Then, a deposition process is initiated to form one or more epitaxial layers on a monocrystalline surface of the substrate. The deposition process is then terminated. The thickness of the epitaxial layer is then determined. If the predetermined thickness of the epitaxial layer is achieved, then the epitaxial process is terminated. However, if the predetermined thickness is not achieved, then steps of deposition and purge are repeated as a cycle until the predetermined thickness is achieved. Further details of this exemplary process are described below.

After loading a substrate into the process chamber, the conditions in the process chamber are adjusted to a predetermined temperature and pressure. The temperature is tailored to the particular conducted process. The appropriate temperature to conduct the epitaxial process may depend on the particular precursors used to deposit the silicon-containing and silicon-germanium containing materials. In some embodiments, the process chamber is maintained at a temperature in a range from about 450 degrees Celsius to about 750 degrees Celsius, or in a range from about 550 degrees Celsius to about 650 degrees Celsius, or in a range from about 500 degrees Celsius to about 650 degrees Celsius during the epitaxial deposition process. In some embodiments, the process chamber is maintained at a pressure in a range from about 0.1 Torr to about 50 Torr, or in a range from about 1 Torr to about 20 Torr, or in a range from about 5 Torr to about 10 Torr during the epitaxial deposition process. The pressure may fluctuate during and between process steps, but is generally maintained constant.

During the epitaxial deposition process the substrate is exposed to a deposition gas to form the first material layer and the second material layer. In some embodiments, the substrate is exposed to the deposition gas for a period of time in a range from about seconds to about 30 seconds, or in a range from about 1 second to about 20 seconds, or in a range from about 5 seconds to about 10 seconds. In particular embodiments, the deposition step lasts for about 10 to 11 seconds. The specific exposure time during the epitaxial deposition process is generally related to the particular precursors and temperature used in the epitaxial deposition process. Generally, the substrate is exposed to the deposition gas long enough to form a targeted thickness of the epitaxial layers in the superlattice structures.

In some embodiments, the deposition gas contains at least a silicon source, and may contain a carrier gas and/or at least one secondary elemental source, such as a germanium source and/or a carbon source.

In some embodiments, the silicon source is usually provided into the process chamber at a rate in a range from about 5 sccm to about 500 sccm, or in a range from about 10 sccm to about 300 sccm, or in a range from about 50 sccm to about 200 sccm, for example, about 100 sccm. Silicon sources useful in the deposition gas to deposit silicon-containing compounds include silanes, halogenated silanes, and organosilanes. Silanes include silane ($SiH_4$) and higher silanes with the empirical formula $Si_xH_{(2x+2)}$, such as disilane ($Si_2H_6$), trisilane ($Si_3H_8$), tetrasilane ($Si_4H_{10}$), and neopentasilane, as well as others. Halogenated silanes include compounds with the empirical formula $X'_ySi_xH_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Organosilane compounds have been found to be advantageous silicon sources as well as carbon sources in embodiments which incorporate carbon in the deposited silicon-containing compound.

In some embodiments where the silicon source is provided with a carrier gas, the carrier gas has a flow rate in a range from about 1 slm (standard liters per minute) to about 100 slm, or in a range from about 5 slm to about 75 slm, or in a range from about slm to about 50 slm, or in a range from about 10 slm to about 20 slm. Carrier gases may include nitrogen ($N_2$), hydrogen ($H_2$), argon, helium, or a combination thereof. In some embodiments, an inert carrier gas is preferred and is selected from nitrogen, argon, helium, or a combination thereof. A carrier gas may be selected based on the precursor(s) used and/or the process temperature during the epitaxial process.

In particular embodiments, where the epitaxial layer is a silicon layer the deposition gas includes disilane.

In some embodiments, the deposition gas used also contains at least one secondary elemental source, such as a germanium source and/or a carbon source. The germanium source may be added to the process chamber with the silicon source and optionally the carrier gas to form a silicon-containing compound, such as a silicon germanium material layer. In some embodiments, the germanium source is provided into the process chamber at a rate in a range from about 0.1 sccm to about 20 sccm, for example, in a range from about 0.5 sccm to about 10 sccm, or in a range from about 1 sccm to about 5 sccm. Germanium sources useful to deposit silicon-containing compounds include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$), and tetragermane ($Ge_4H_{10}$), as well as others. Organogermanes include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). Germanes and organogermane compounds have been found to be advantageous germanium sources and carbon sources in embodiments while incorporating germanium and carbon into the deposited silicon-containing compounds, namely SiGe and SiGe:C compounds. In some embodiments, the germanium concentration in the epitaxial layer is in the range from about 1 atomic % to about 30 atomic %, for example, about 20 atomic %. In some embodiments, the germanium concentration may be graded within an epitaxial layer as discussed herein.

A carbon source may be added during deposition to the process chamber with the silicon source and/or germanium source, and optionally the carrier gas to form a silicon-containing compound, such as a silicon carbon material (e.g., Si:C) or a silicon germanium carbon material (e.g., SiGe:C). In some embodiments, the carbon source is provided into the process chamber at a rate in a range from about 0.1 sccm to about 40 sccm, or in a range from about 3 sccm to about 25 sccm, or in a range from about 5 sccm to about 25 sccm. The carbon source may be 5% diluted in argon or nitrogen gas and flowed at a rate of 750 sccm. Carbon sources useful to deposit silicon-containing compounds include organosilanes, alkyls, alkenes and alkynes of ethyl, propyl and butyl. Such carbon sources include methylsilane ($CH_3SiH_3$), dimethylsilane (($CH_3$)$_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. In some embodiments, the carbon concentration of an epitaxial layer is in the range from about 200 ppm to about 5 atomic %, or in a range from about 1 atomic % to about 3 atomic %. In some embodiments, the carbon concentration may be graded within an epitaxial layer, preferably graded with a lower carbon concentration in the initial portion of the epitaxial layer than in the final portion of the epitaxial layer. Alternatively, a germanium source and a carbon source may both be added during deposition into the process chamber with the silicon source and carrier gas to form a silicon-containing compound, such as a silicon carbon or silicon germanium carbon material.

In a particular embodiment, the first epitaxial layer, which is a silicon layer, is formed using disilane and the second epitaxial layer, which is a silicon germanium layer, is formed with dichlorosilane and germane. Using dichlorosilane provides for a high growth rate process with chlorine-surface termination, which leads to excellent interfacial abruptness. This interfacial abruptness contributes to improved etch selectivity of the silicon and germanium containing layers relative to the silicon layers.

In some embodiments, after the deposition process is terminated, the process chamber may be flushed with a purge gas or the carrier gas and/or the process chamber may be evacuated with a vacuum pump. The purging and/or evacuating processes remove excess deposition gas, reaction by-products and other contaminants. In some embodiments, the process chamber may be purged in between deposition of the first layer and the second layer. In one embodiment, the process chamber may be purged for about 10 seconds by flowing a carrier gas at about 5 slm. A cycle of deposition and purge may be repeated for numerous cycles.

Figure 2A:
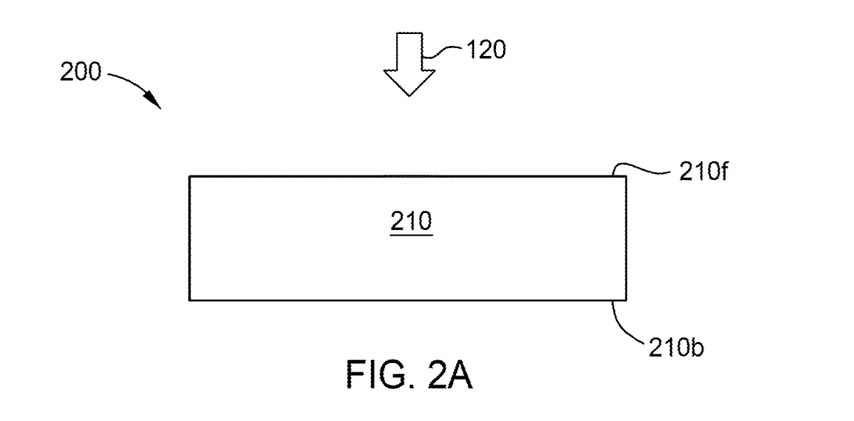
FIGS. 2A-2B illustrate cross-sectional views of various stages of manufacturing a superlattice structure in accordance with one or more implementations of the present disclosure.
Figure 2B:
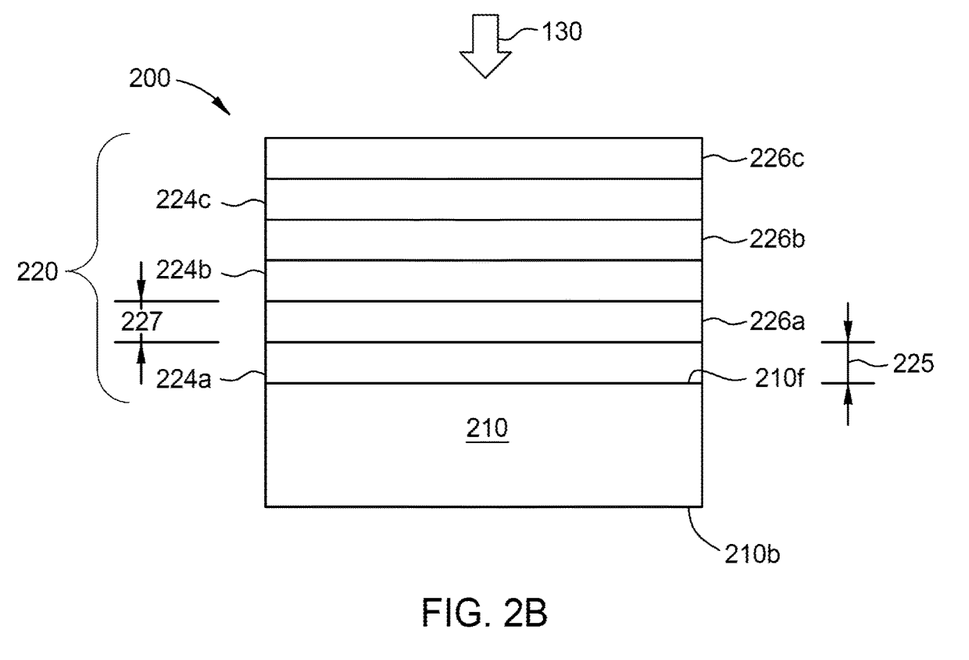
Figure 3:
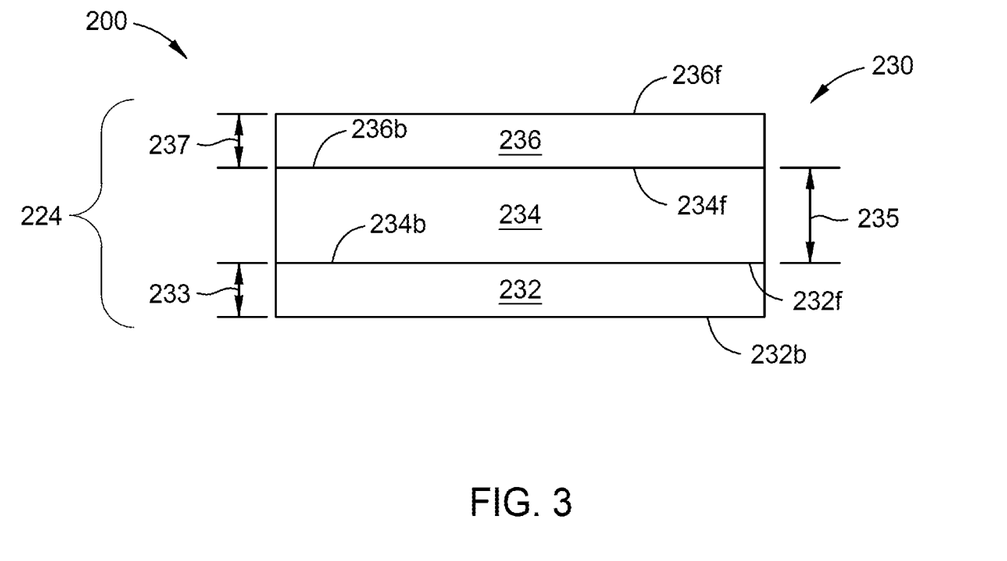
FIG. 3 illustrates a cross-sectional view of a portion of a superlattice structure in accordance with one or more implementations of the present disclosure.

With reference to FIGS. 2A-2B and FIG. 3, cross-sectional views of some embodiments of a device structure for semiconductor devices at various stages of manufacture are provided to illustrate the method of FIG. 1. Although FIGS. 2A-2B and FIG. 3 are described in relation to the method 100, it will be appreciated that the structures disclosed in FIGS. 2A-2B and FIG. 3 are not limited to the method 100, but instead may stand alone as structures independent of method 100. Similarly, although the method 100 is described in relation to FIGS. 2A-2B and FIG. 3, it will be appreciated that the method 100 is not limited to the structures disclosed in FIGS. 2A-2B and FIG. 3, but instead may stand alone independent of the structures disclosed in FIGS. 2A-2B and FIG. 3.

FIG. 2A illustrates a cross-sectional view of a semiconductor device structure 200 during intermediate stages of manufacturing corresponding to operations 110 and 120 of the method 100, in accordance with some embodiments. The semiconductor device structure 200 includes a substrate 210. The substrate 210 may be a substrate as described in operation 110. The substrate 210 has a frontside 210f (also referred to as a front surface) and a backside 210b (also referred to as a back surface) opposite the frontside 210f. The substrate 210 may be exposed to a pre-clean process as described in operation 120. Next, as shown in FIG. 2B, a superlattice structure 220 as described herein is formed over the frontside 210f of the substrate 210.

FIG. 2B illustrates a cross-sectional view of the semiconductor device structure 200 during intermediate stages of manufacturing corresponding to operation 130, in accordance with some embodiments. The superlattice structure 220 includes a plurality of first material layers 224a-c and a corresponding plurality of second material layers 226a-c alternatingly arranged in a plurality of stacked pairs. In one embodiment, the plurality of first material layers 224a-c are formed from at least a silicon-containing material and a germanium-containing material. In one embodiment, the plurality of second material layers 226a-c are formed from at least a silicon-containing material. Accordingly, the first material layers 224a-c and the second material layers 226a-c are different materials. In some embodiments, the plurality of first material layers 224a-c and corresponding plurality of second material layers 226a-c are lattice matched materials with a sufficient difference in composition such that selective layer removal or layer modification can subsequently be performed.

In some embodiments, the plurality of first material layers 224a-c and corresponding plurality of second material layers 226a-c may be any number of lattice matched material pairs suitable for forming the superlattice structure 220. For example, the plurality of first material layers 224a-c and corresponding plurality of second material layers 226a-c include between about 2 to about 5 pairs of lattice matched materials, for example, 3 pairs of lattice matched materials as is shown in FIG. 2B.

The material layers of the superlattice structure 220 may have controlled thicknesses to provide for substantially defect free crystallographic profiles of the various materials. In some embodiments, the layers of the superlattice structure 220 have a total thickness in a range from about 3 nm to about 50 nm, or in a range from about 5 nm to about 40 nm, or in a range from about 5 nm to about 30 nm, or in a range from about 5 nm to about 20 nm. In some embodiments, the layers of the superlattice structure 220 have a thickness in a range from about 3 nm to about 50 nm. For example, the plurality of first material layers 224a-c may have a thickness 225 in a range from about 1 nm to about 20 nm or, or in a range from about 1 nm to about 10 nm, or in a range from about 3 nm to about 10 nm, or in a range from about 5 nm to about 7 nm, for example, about 6 nm. The plurality of second material layers 226a-c may have a thickness 227 in a range from about 1 nm to about 20 nm, or in a range from about 5 nm and about 15 nm, or in a range from about 7 nm to about 10 nm, for example, about 8 nm.

FIG. 3 illustrates a cross-sectional view of a portion of the semiconductor device structure 200 during intermediate stages of manufacturing corresponding to operation 130, in accordance with some embodiments. In some embodiments, the first material layer 224 is a multi-layer structure 230 as shown in FIG. 3. The multi-layer structure 230 may include a first silicon germanium layer 232 or first silicon germanium cladding layer having a backside interface 232b and a frontside interface 232f, and a second silicon germanium layer 234 or core layer having a backside interface 234b and a frontside interface 234f, and a third silicon germanium layer 236 or second silicon germanium cladding layer having a backside interface 236b and a frontside interface 236f. The first silicon germanium layer 232 has a first germanium concentration and a first thickness 233, the second silicon germanium layer 234 has a second germanium concentration and a second thickness 235, and the third silicon germanium layer 236 has a third germanium concentration and a third thickness 237. As depicted in FIG. 3, in some embodiments, the second silicon germanium layer 234 may be positioned in between or sandwiched in between the first silicon germanium layer 232 and the third silicon germanium layer 236. In some embodiments, the first germanium concentration and the third germanium concentration may be greater than the second germanium concentration and the first thickness and the third thickness are less than the second thickness.

In some embodiments, a concentration gradient of germanium is formed within the first material layer 224. The concentration gradient of germanium may be continuous or stepwise. The concentration gradient of germanium may be formed in a direction normal to the frontside interface 236f of the third silicon germanium layer 236. The concentration gradient of germanium can vary from a high concentration to a low concentration in one direction or vice versa. In some embodiments, the concentration gradient of germanium can vary from a high concentration to a low concentration in one direction and then return to a high concentration or vice versa. In some embodiments described herein, one or more regions of the first material layer may include more complex gradients of germanium such as a high/low/high or low/high/low germanium. In some embodiments, the concentration gradient is set such that the germanium concentration decreases with an increase in distance from dissimilar materials, for example, the dissimilar material in either the second material layer 226 or the substrate 210. In some embodiments, with reference to FIG. 3, for example, germanium concentration may be highest at the frontside interface 236f and the backside interface 232b. Having germanium concentration be highest at interfaces that contact material layers of different material provides for improved etch selectivity between the first material layer 224 and the second material layer 226. For example, having a higher germanium concentration at the frontside interface 236f, which may contact one of the second material layers 226a-c, and a higher germanium concentration at the backside interface 232b, which contacts either one of the second material layers 226a-c or the frontside 210f of the substrate 210 provides for improved etch selectivity when removing the first material layer 224.

In some embodiments, a concentration gradient of germanium is formed within at least one of the first silicon germanium layer 232, the second silicon germanium layer 234, and the third silicon germanium layer 236. For example with reference to FIG. 3, in some embodiments, the first silicon germanium layer 232 and the third silicon germanium layer 236 have a consistent concentration of germanium throughout and the second silicon germanium layer has a concentration gradient of germanium. The concentration gradient of germanium in the second silicon germanium layer 234 may decrease from the backside interface 234b toward the center region of the second silicon germanium layer 234 and then increase again from the center region of the second silicon germanium layer 234 to the frontside interface 234f.

Figure 4A:
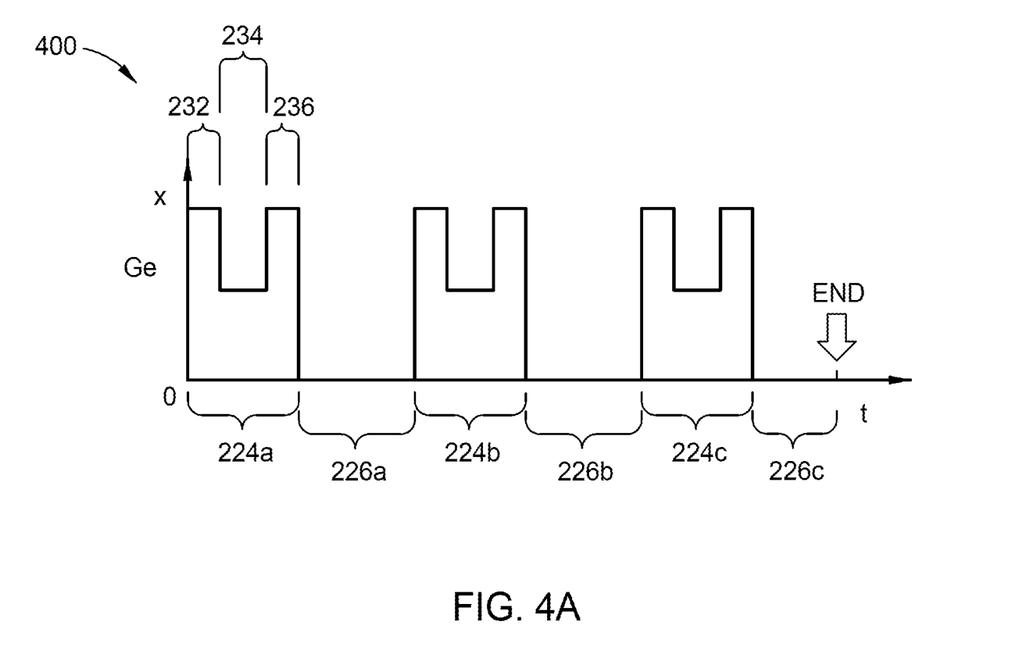
FIGS. 4A-4B illustrate germanium concentration diagrams for a portion of a superlattice structure in accordance with one or more implementations of the present disclosure.

FIG. 4A illustrates a germanium concentration diagram 400 for manufacturing a superlattice structure in accordance with one or more implementations of the present disclosure. The axis labeled 0 to t of the germanium concentration diagram 400 represents time and the axis labeled 0 to x represents germanium concentration in the deposited layer. In some embodiments, as depicted in FIG. 4A, the first material layers 224a-c are silicon germanium layers and the second material layers 226a-c are silicon layers. The germanium concentration diagram 400 shows an example where germanium concentration varies within the first material layers 224a-c but is highest at the interfaces between the first material layers 224a-c and the second material layers 226a-c.

Figure 4B:
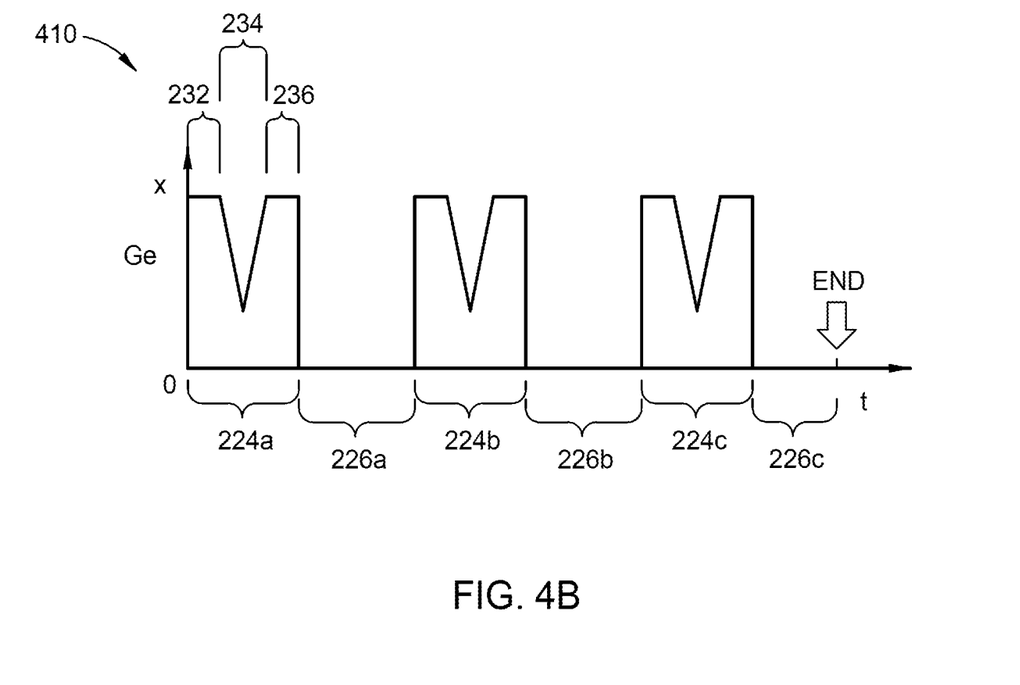

FIG. 4B illustrates another germanium concentration diagram 410 for manufacturing a superlattice structure in accordance with one or more implementations of the present disclosure. The germanium concentration diagram 410 is similar to the germanium concentration diagram 400 shown in FIG. 4A, except that germanium concentration varies-shown in the germanium concentration diagram 410 varies within the second silicon germanium layer 234 by decreasing from the interface between the frontside interface 232f and the backside interface 234b into the second silicon germanium layer 234 but then increases toward the interface between the frontside interface 234f and the backside interface 236b.

Figure 5:
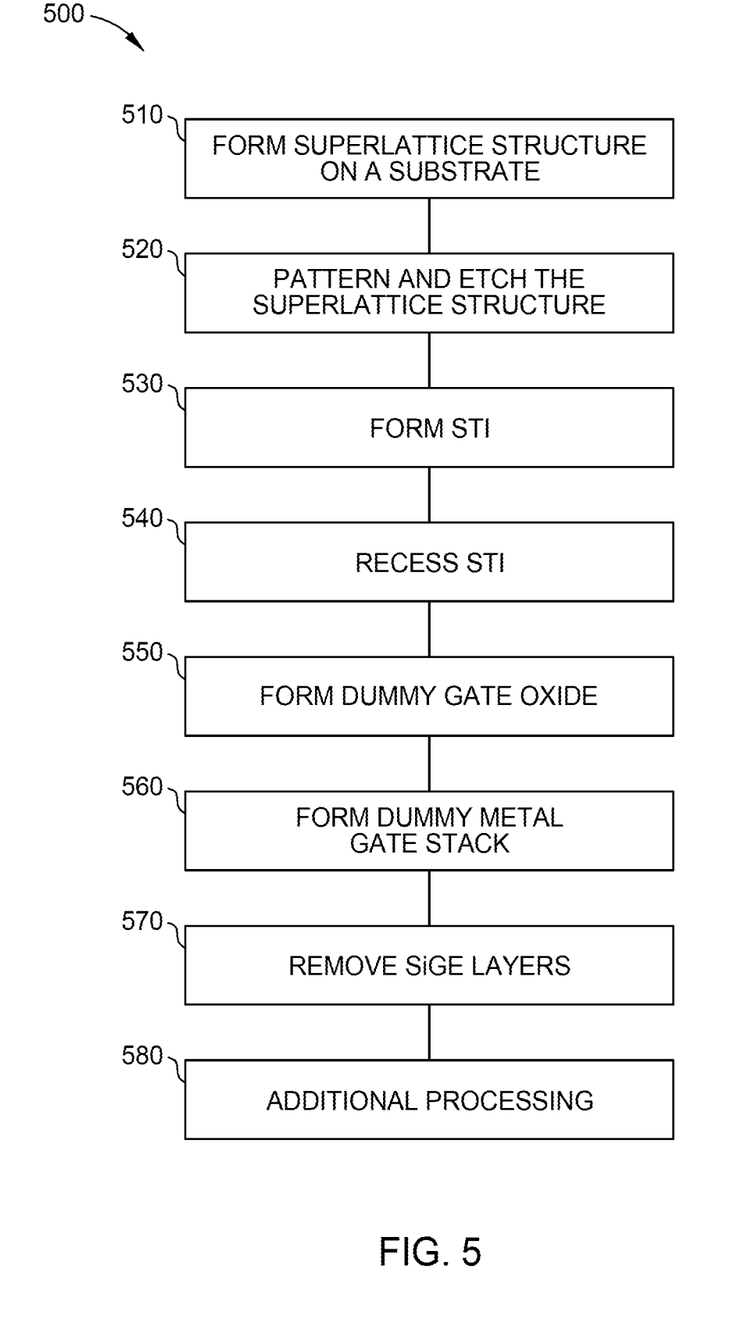
FIG. 5 illustrates a flow chart of a method for manufacturing a transistor device structure incorporating a superlattice structure in accordance with one or more implementations of the present disclosure.

FIG. 5 illustrates a flow chart of a method 500 for manufacturing a transistor device incorporating a superlattice structure in accordance with one or more implementations of the present disclosure. FIGS. 6A-6F illustrate cross-sectional views of various stages of manufacturing a transistor device incorporating a superlattice structure in accordance with one or more implementations of the present disclosure. The transistor device may be a GAA device. Although FIGS. 6A-6F are described in relation to the method 500, it will be appreciated that the structures disclosed in FIGS. 6A-6F are not limited to the method 500, but instead may stand alone as structures independent of the method 500. Similarly, although the method 500 is described in relation to FIGS. 6A-6F, it will be appreciated that the method 500 is not limited to the structures disclosed in FIGS. 6A-6F, but instead may stand alone independent of the structures disclosed in FIGS. 6A-6F.

At operation 510 of the method 500, a superlattice structure is formed on a substrate, for example, the superlattice structure 220 formed on the substrate 210 as shown in FIG. 2B.

Figure 6A:
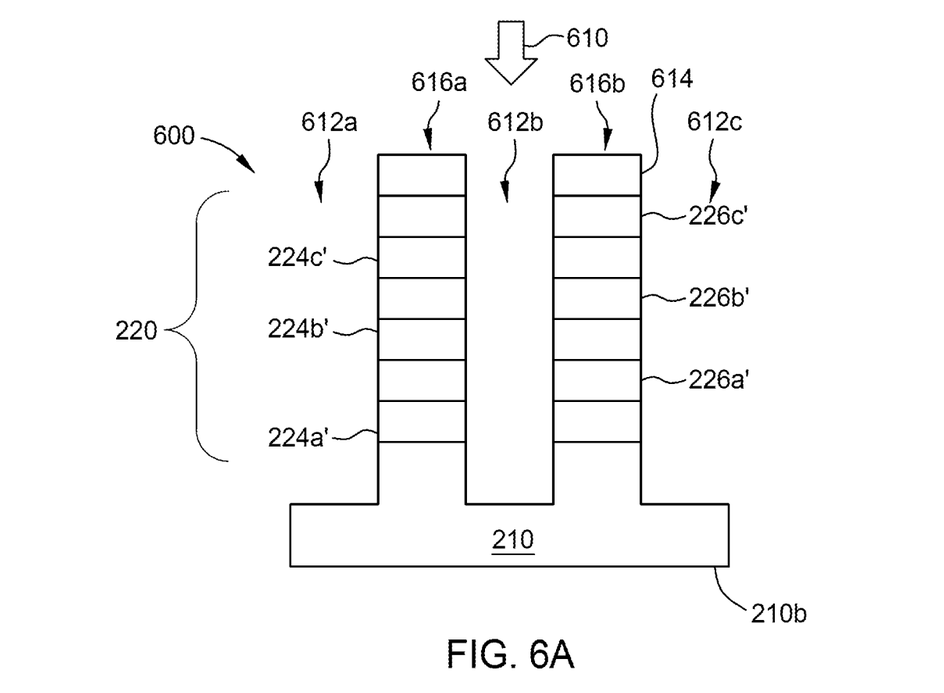
FIGS. 6A-6F illustrate cross-sectional views of various stages of manufacturing a transistor device structure incorporating a superlattice structure in accordance with one or more implementations of the present disclosure.

FIG. 6A illustrates a cross-sectional view of a portion of the semiconductor device structure 600 during intermediate stages of manufacturing corresponding to operation 520, in accordance with some embodiments. At operation 520, a patterning and etching process 610 is performed to form trenches 612a-c in the superlattice structure 220, after a hardmask layer 614 is deposited on the top surface of the superlattice structure 220. In some embodiments, photolithography techniques are utilized to pattern the hardmask layer 614. Generally, a photoresist material (not shown) is deposited over the hardmask layer 614. The photoresist material is irradiated (exposed) with radiation, for example, light, through a patterned reticle in order to induce a reaction in the portions of the photoresist material exposed to the energy. The photoresist material is developed to remove a portion of the photoresist material, wherein the remaining photoresist material protects the underlying material from subsequent processing steps, such as etching.

As shown in FIG. 6A, after the etching process is performed to the superlattice structure 220, remaining regions of the superlattice structure 220 and the underlying substrate 210 form fins, such as a first fin 616a and a second fin 616b (collectively referred to as fins 616). As can be seen in FIG. 6A, the fins 616 include portions of the superlattice structure 220 (e.g., portions of the first material layers 224a'-c' (e.g., SiGe layers) and portions of the second material layers 226a'-c' (e.g., silicon layers)), and portions of the substrate 210. Although two fins, the first fin 616a and the second fin 616b, are shown in FIG. 6A, it is to be understood that any suitable number and type of fins may be utilized.

Figure 6B:
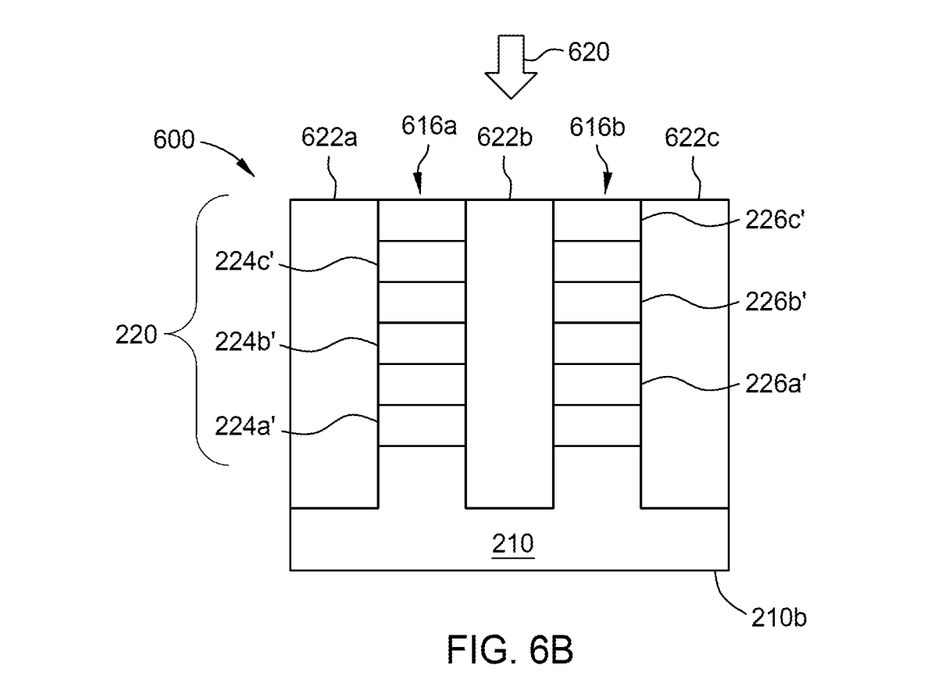

FIG. 6B illustrates a cross-sectional view of a portion of the semiconductor device structure 600 during intermediate stages of manufacturing corresponding to operation 530, in accordance with some embodiments. At operation 530, shallow trench isolations (STIs) 622a-c are formed, in accordance with some embodiments. At operation 530 a deposition process 620 may be performed to deposit a dielectric insulating material in the trenches 612a-c between adjacent fins 616 to form STIs 622a-c. The STIs 622a-c may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations thereof, or the like. In some embodiments, the deposition process 620 is a process such as CVD, flowable CVD (FCVD), or a spin-on-glass process, although any acceptable process may be utilized. Subsequently, the STIs 622a-c may be subject to one or more of a hardmask removal process and a process for removal of portions of the STIs 622a-c extending over the top surfaces of the fins 616a-b using, for example, an etch process, chemical mechanical polishing (CMP), or the like.

Figure 6C:
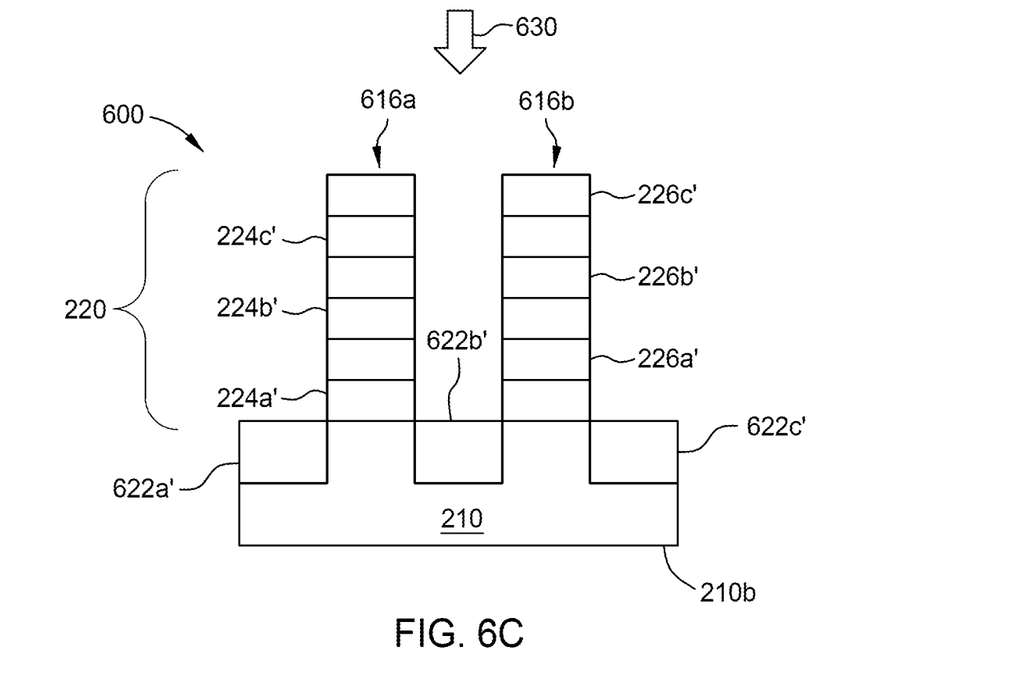

FIG. 6C illustrates a cross-sectional view of a portion of the semiconductor device structure 600 during intermediate stages of manufacturing corresponding to operation 540, in accordance with some embodiments. At operation 540, the sidewalls of the fins 616a-b may be exposed by recessing of the STIs 622a-c to form recessed STIs 622a'-c'. In some embodiments, the STIs 622a-c are recessed using one or more selective etch processes 630 utilizing the fins 616a-b as an etch mask. For example, the STIs 622a-c are recessed using one or more etching processes. A depth of the recessed STIs 622a'-c' may be determined by a height of the superlattice structure 220. In some embodiments, the recess extends to a depth such that the bottom-most first material layer 224a' is exposed. Alternatively, a bottom-most first material layer 224a' (e.g., SiGe layer) may remain below the upper surface of the recessed STIs 622a'-c'.

Figure 6D:
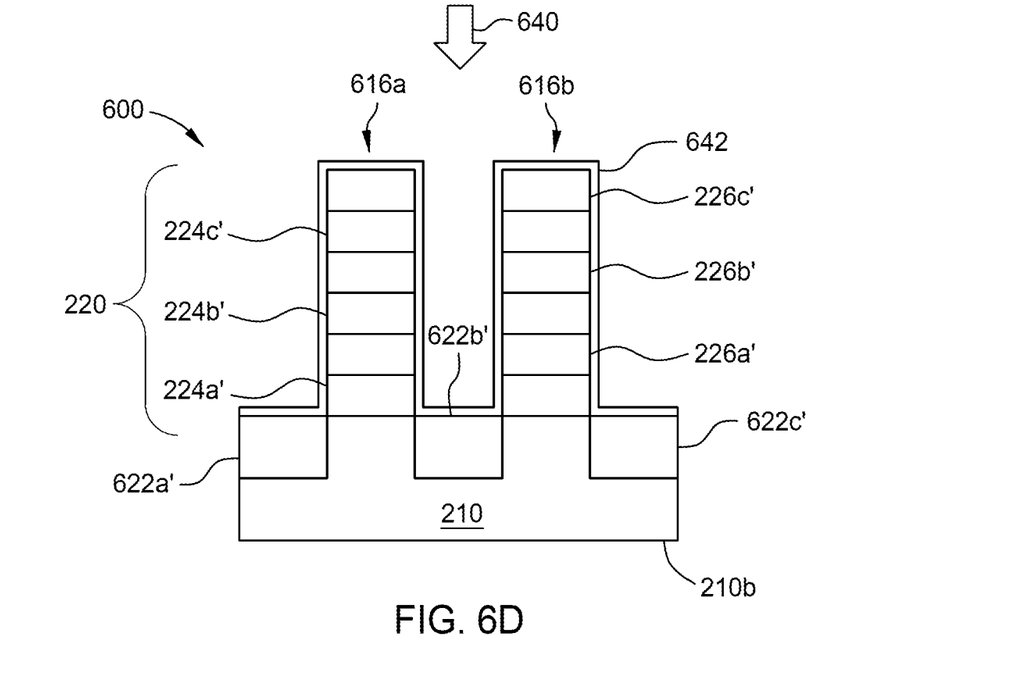

FIG. 6D illustrates a cross-sectional view of a portion of the semiconductor device structure 600 during intermediate stages of manufacturing corresponding to operation 550, in accordance with some embodiments. At operation 550, a dummy gate oxide layer 642 is formed over the exposed fins 616a-b. In some embodiments, the dummy gate oxide layer 642 may be formed by a deposition process 640, for example, thermal oxidation, CVD, sputtering, or any other methods known and used in the art for forming a dummy gate oxide layer 642. In some embodiments, the dummy gate oxide layer 642 may be formed of a same material as the STIs 622a-c. In other embodiments, the dummy gate oxide layer 642 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate oxide layer 642 includes dielectric materials having a high dielectric constant (k-value), for example, greater than 3.9. The materials may include silicon nitrides, oxynitrides, metal oxides such as $HfO_2$, $HfZrOx$, $HfSiOx$, $HfTiOx$, $HfAlOx$, a combination thereof, multi-layers thereof, or the like.

Figure 6E:
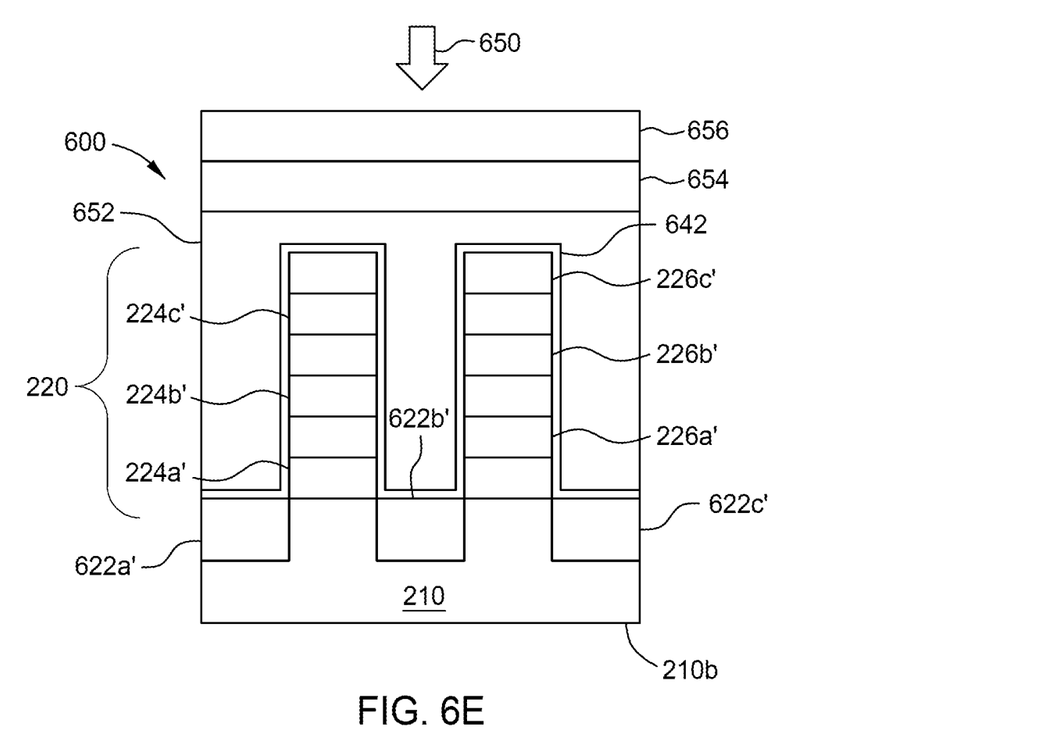

FIG. 6E illustrates a view of a portion of the semiconductor device structure 600 during intermediate stages of manufacturing corresponding to operation 560, in accordance with some embodiments. At operation 560, a dummy metal layer 652 may be deposited over the dummy gate oxide layer 642 (shown in FIG. 6D). In an embodiment, the dummy metal layer 652 is a conductive material and may be selected from a group comprising polycrystalline-silicon (poly-Si), poly-crystalline silicon-germanium (poly-SiGe), metallic nitrides, metallic silicides, metallic oxides, and metals. In an embodiment, the dummy metal layer 652 may be deposited by a deposition process 650, for example, PVD, CVD, sputter deposition, or other techniques known and used in the art for depositing conductive materials. Other materials, conductive and non-conductive, may be used. The top surface of the dummy metal layer 652 may be planarized after it is deposited.

In some embodiments, a first hardmask layer 654 is deposited over the dummy metal layer 652 through a deposition process such as CVD, or a spin-on-glass process, although any acceptable process may be utilized. In particular embodiments, the first hardmask layer 654 may be an oxide layer (e.g., silicon oxide) and may have a thickness in a range from about 10 Å to about 50 Å. A second hardmask layer 656 may then be deposited on the first hardmask layer 654 through a process such as CVD, or a spin-on-glass process, although any acceptable process may be utilized. In particular embodiments, the second hardmask layer 656 may be a nitride (e.g., silicon nitride). The second hardmask layer 656 may have a thickness from about 150 Å to about 850 Å. The first hardmask layer 654 and the second hardmask layer 656 may be patterned to form a dummy gate hardmask layer stack (not shown) over the dummy metal layer 652. In particular embodiments, a polysilicon etch and a dummy oxide removal process are performed using the dummy gate hardmask layer stack to pattern the dummy metal layer 652 and the dummy gate oxide layer 642. During patterning, portions of the dummy metal layer 652 and portions of the dummy gate oxide layer 642 are removed from source/drain areas of the fins 616a-b and portions of the dummy metal layer 652 and portions of the dummy gate oxide layer 642 remain over a channel region of the fins 616a-b to form a dummy metal gate electrode (not shown). The dummy metal gate electrode may include the patterned dummy metal layer and the patterned dummy metal gate oxide layer disposed below the patterned dummy metal layer. The dummy metal gate electrode and the dummy gate hardmask layer stack collectively form a dummy metal gate stack (not shown).

The dummy metal gate stack may then be used to define and form source/drain regions from the exposed portions of fins 616a-b. The dummy metal gate stack may then be removed to allow processing to be performed to define and form channel regions from the center portions of fins 616a-b (not shown).

Figure 6F:
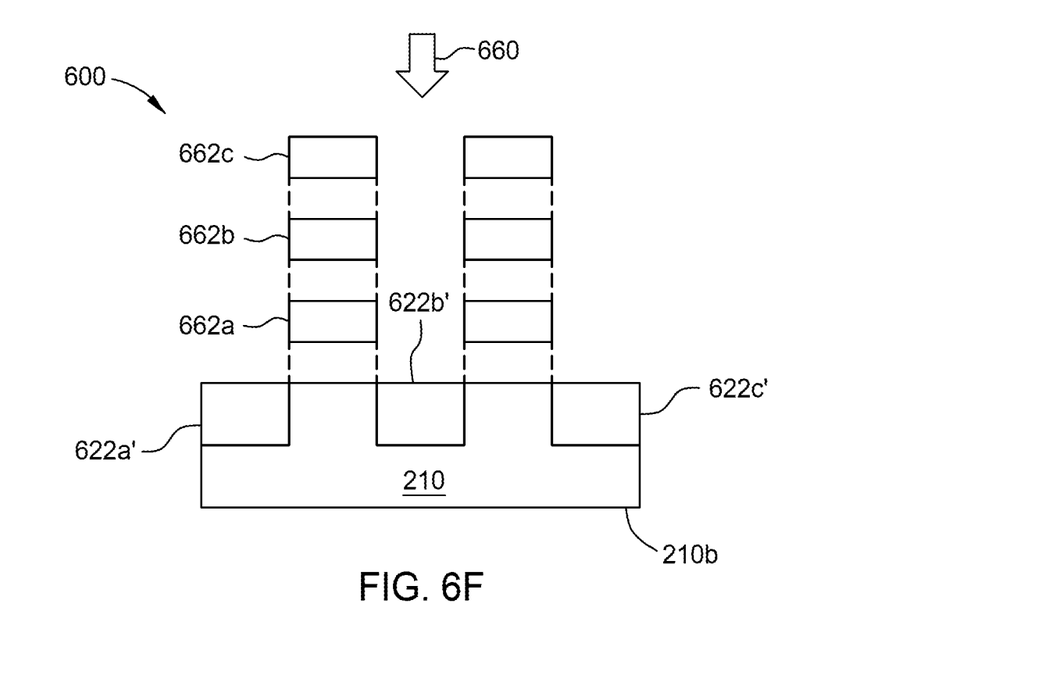

FIG. 6F illustrates a cross-sectional view of a portion of the semiconductor device structure 600 during intermediate stages of manufacturing corresponding to operation 570, in accordance with some embodiments. At operation 570, a removal process for the first material layers 224a-c (e.g., SiGe layers) is performed. After removal of the first material layers 224a-c (indicated with dashed lines in FIG. 6F), the second material layers 226a-c remain in the fins 616a-b. In particular embodiments, in which the first material layers 224a-c are formed of silicon germanium (SiGe) and the second material layers 226a-c are formed of silicon (Si), the first material layers 224a-c may be removed, for example, by a removal process 660. In some embodiments, the removal process 660 may use an etchant that etches the silicon germanium at a higher rate than the silicon, such as NH$_4$OH:H$_2$O$_2$:H$_2$O (ammonia peroxide mixture, APM), H$_2$SO$_4$+H$_2$O$_2$ (sulfuric acid peroxide mixture, SPM), or the like. Other suitable processes and materials may be used. This etching process removes the first material layers 224a-c. Thus, first nanowires 662a-c or nanosheets are formed from fins 616a-b for an n-type device. In some embodiments, after etching, a bottom-most first layer 224a (e.g., SiGe layer) may remain below the upper surface of the recessed STIs 622a'-c' as a stress layer within the first fin 616a and the second fin 616b to provide certain strains or relaxations of the fin materials.

After operation 570, the semiconductor device structure 600 may be subjected to additional processing at operation 580 to form the final device structure, for example, a GAA device.

In the Summary and in the Detailed Description, and the Claims, and in the accompanying drawings, reference is made to particular features (including method operations) of the present disclosure. It is to be understood that the disclosure in this specification includes all possible combinations of such particular features. For example, where a particular feature is disclosed in the context of a particular aspect, implementation, or example of the present disclosure, or a particular claim, that feature can also be used, to the extent possible in combination with and/or in the context of other particular aspects and implementations of the present disclosure, and in the present disclosure generally.

Embodiments and all of the functional operations described in this specification can be implemented in digital electronic circuitry, or in computer software, firmware, or hardware, including the structural means disclosed in this specification and structural equivalents thereof, or in combinations of them. Embodiments described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The term "comprises" and grammatical equivalents thereof are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components. In addition, whenever a composition, an element or a group of elements is preceded with the transitional phrase "comprising" or grammatical equivalents thereof, it is understood that it is contemplated that the same composition or group of elements may be preceded with transitional phrases "consisting essentially of," "consisting of," "selected from the group of consisting of," or "is" preceding the recitation of the composition, element, or elements and vice versa.

When introducing elements of the present disclosure or exemplary aspects or embodiment(s) thereof, the articles "a," "an," "the" and "said" are intended to mean that there are one or more of the elements.

While the foregoing is directed to embodiments of the present disclosure, other and further embodiments of the disclosure may be devised without departing from the basic scope thereof, and the scope thereof is determined by the claims that follow.

The invention claimed is:

1. A device structure, comprising:
a substrate;
a superlattice structure formed over the substrate, the superlattice structure comprising:
one or more superlattice stacks, comprising:
a silicon material layer;
a first silicon germanium cladding layer having a first germanium concentration and a first thickness;
a silicon germanium core layer having a second germanium concentration and a second thickness; and
a second silicon germanium cladding layer having a third germanium concentration and a third thickness,
wherein the silicon material layer, the first silicon germanium cladding layer, the silicon germanium core layer, and the second silicon germanium cladding layer are disposed in a stacked arrangement,
wherein the silicon germanium core layer is positioned between the first silicon germanium cladding layer and the second silicon germanium cladding layer,
wherein the first germanium concentration and the third germanium concentration are each greater than the second germanium concentration and the first thickness and the third thickness are each less than the second thickness, and
wherein the first thickness, the second thickness, and the third thickness have a total thickness in a range from 5 nm to 20 nm.

2. The device structure of claim 1, wherein a surface of the first silicon germanium cladding layer contacts a surface of the substrate and a surface of the second silicon germanium cladding layer contacts a surface of the silicon material layer.

3. The device structure of claim 1, wherein at least one of the first silicon germanium cladding layer, the silicon germanium core layer, and the second silicon germanium cladding layer further comprises carbon or boron.

4. The device structure of claim 1, wherein the first germanium concentration is in a range from 10% to 50%.

5. The device structure of claim 1, wherein the first germanium concentration is in a range from 20% to 40%.

6. The device structure of claim 1, wherein the first thickness and the third thickness are each independently in a range from 1 nm to 10 nm.

7. The device structure of claim 6, wherein the silicon material layer has a thickness in a range from 5 nm to 20 nm.

8. The device structure of claim 1, wherein the superlattice structure comprises between 2 and 5 of the superlattice stacks.

9. The device structure of claim 1, wherein the substrate comprises silicon {110}.

10. A method of forming a device structure, comprising:
forming a superlattice structure on a substrate, comprising:
forming a first superlattice stack over the substrate, comprising:
forming a first silicon germanium structure using a first deposition process with a first precursor material and a second precursor material, comprising:
forming a first silicon germanium cladding layer having a first germanium concentration and a first thickness;
forming a silicon germanium core layer on the first silicon germanium cladding layer, the silicon germanium core layer having a second germanium concentration and a second thickness; and
forming a second silicon germanium cladding layer on the silicon germanium core layer, the second silicon germanium cladding layer having a third germanium concentration and a third thickness,
forming a first silicon layer using a second deposition process with a third precursor material,
wherein the first germanium concentration and the third germanium concentration are each greater than the second germanium concentration and the first thickness and the third thickness are each less than the second thickness, and
wherein the first thickness, the second thickness, and the third thickness have a total thickness in a range from 5 nm to 20 nm.

11. The method of claim 10, wherein the first deposition process and the second deposition process are epitaxial deposition processes.

12. The method of claim 11, wherein the first deposition process and the second deposition process are performed in the same processing chamber.

13. The method of claim 11, wherein the first deposition process is performed at a temperature in a range from 600 degrees Celsius to 680 degrees Celsius and at a pressure in a range from 1 Torr to 10 Torr.

14. The method of claim 10, wherein the first precursor material is dichlorosilane, the second precursor material is germane, and the third precursor material is disilane.

15. The method of claim 10, wherein the first deposition process is performed with a fourth precursor material, the fourth precursor material is a carbon-containing precursor material.

16. The method of claim 10, wherein forming the silicon germanium core layer on the first silicon germanium cladding layer comprises decreasing a flow rate of the second precursor material followed by increasing the flow rate of the second precursor material to create a germanium concentration gradient within the silicon germanium core layer.

17. The method of claim 16, wherein the germanium concentration gradient decreases with an increase in distance from dissimilar materials.

18. The method of claim 10, wherein the first thickness and the third thickness are each independently in a range from 1 nm to 10 nm.

19. A method of forming a device structure, comprising:
forming a superlattice structure on a substrate, wherein the substrate comprises silicon {110}, comprising:
forming a plurality of superlattice stacks over the substrate, comprising:
forming a first silicon germanium structure using a first deposition process with a first silicon-containing precursor material and a second germanium-containing precursor material, comprising:
forming a first silicon germanium cladding layer having a first germanium concentration and a first thickness;
forming a silicon germanium core layer on the first silicon germanium cladding layer, the silicon germanium core layer having a second germanium concentration and a second thickness; and
forming a second silicon germanium cladding layer on the silicon germanium core layer, the second silicon germanium cladding layer having a third germanium concentration and a third thickness, wherein the first germanium concentration and the third germanium concentration are each greater than the second germanium concentration; and
forming a first silicon layer over the first silicon germanium structure using a second deposition process with a second silicon-containing precursor material, wherein the first thickness and the third thickness are each less than the second thickness, wherein the first thickness, the second thickness, and the third thickness have a total thickness in a range from 5 nm to 20 nm and the first silicon germanium cladding layer is adjacent to the substrate.

20. The method of claim 19, further comprising forming a gate all-around transistor from the substrate and the superlattice structure.

* * * * *

UNITED STATES PATENT AND TRADEMARK OFFICE
CERTIFICATE OF CORRECTION

| | | |
|---|---|---|
| PATENT NO. | : 12,363,971 B2 | Page 1 of 1 |
| APPLICATION NO. | : 18/097722 | |
| DATED | : July 15, 2025 | |
| INVENTOR(S) | : Yi-Chiau Huang et al. | |

It is certified that error appears in the above-identified patent and that said Letters Patent is hereby corrected as shown below:

In the Specification

In Column 7, Line 5, delete "silicon: germanium" and insert -- silicon:germanium --.

In Column 8, Line 32, delete "about seconds" and insert -- about 0.5 seconds --.

In Column 8, Line 54, delete "SixH (2x+2)," and insert -- SixH(2x+2), --.

In Column 8, Lines 57-58, delete "X'ySixH (2x+2-y)," and insert -- X'ySixH(2x+2-y), --.

In Column 8, Lines 61-62, delete "RySixH (2x+2-y)," and insert -- RySixH(2x+2-y), --.

In Column 9, Line 7, delete "about slm" and insert -- about 10 slm --.

In Column 9, Lines 30-31, delete "GexH (2x+2)," and insert -- GexH(2x+2), --.

In Column 12, Line 63, delete "concentration varies-" and insert -- concentration --.

In the Claims

In Column 19, Line 1, in Claim 19, delete "a second" and insert -- a --.

Signed and Sealed this
Tenth Day of February, 2026

John A. Squires
*Director of the United States Patent and Trademark Office*